(12) United States Patent
Narasimhan

(10) Patent No.: US 8,767,879 B1
(45) Date of Patent: Jul. 1, 2014

(54) COMPENSATION FOR RESIDUAL FREQUENCY OFFSET, PHASE NOISE AND SAMPLING PHASE OFFSET IN WIRELESS NETWORKS

(75) Inventor: Ravi Narasimhan, Los Altos, CA (US)

(73) Assignee: Marvell International Ltd., Hamilton (BM)

(*) Notice: Subject to any disclaimer, the term of this patent is extended or adjusted under 35 U.S.C. 154(b) by 0 days.

(21) Appl. No.: 13/548,883

(22) Filed: Jul. 13, 2012

Related U.S. Application Data

(63) Continuation of application No. 12/615,605, filed on Nov. 10, 2009, now Pat. No. 8,223,893, which is a continuation of application No. 12/070,375, filed on Feb. 15, 2008, now Pat. No. 7,616,719, which is a continuation of application No. 10/193,439, filed on Jul. 10, 2002, now Pat. No. 7,346,135.

(60) Provisional application No. 60/356,475, filed on Feb. 13, 2002.

(51) Int. Cl.
*H04L 27/00* (2006.01)
*H04L 7/00* (2006.01)
*H04L 23/00* (2006.01)

(52) U.S. Cl.
USPC ............ 375/316; 375/326; 375/355; 375/377

(58) Field of Classification Search
CPC .................... H04B 2201/7071; H04B 1/7075; H04B 1/7085; H04L 1/205; H04L 27/2657; H04L 27/2675; H04L 25/03019; H04L 2027/0067; H04L 27/22; H04L 27/2695; H03L 7/0814; H03L 7/091; H04J 3/0638; H04J 3/06; H03M 1/0607; H03M 1/0624; H03M 1/0836
USPC ................. 375/260, 219, 316, 324–326, 355, 375/362–366, 371, 377, E1.003, E1.016, 375/E1.018, 354, 149; 370/203, 208, 210, 370/516; 329/304, 306, 307, 315; 327/358, 327/350, 360; 455/260, 183.1; 398/202; 360/51; 712/E9.063; 713/400
IPC ....... H04L 27/00,27/38; H04J 3/06; G06F 1/12; H03L 7/091, 7/00, 7/089
See application file for complete search history.

(56) References Cited

U.S. PATENT DOCUMENTS 5,023,624 A 6/1991 Heckaman et al.
5,245,611 A * 9/1993 Ling et al. .................... 370/347

(Continued)

FOREIGN PATENT DOCUMENTS

EP 1160981 A2 5/2001
JP 2008-079813 A 3/1996

(Continued)

OTHER PUBLICATIONS

Abramowitz, "Handbook of Mathematical Functions", 1972, Dover; p. 69.

(Continued)

*Primary Examiner* — Tesfaldet Bocure

(57) ABSTRACT

A transceiver includes a channel estimator configured to generate, based on a packet received over a channel, an initial channel estimate for the channel. A compensator is configured to compensate a phase of the initial channel estimate to adjust for a carrier frequency offset associated with the channel, and ii) selectively compensate the initial channel estimate for sampling phase jitter. The selectively compensating the initial channel estimate for sampling phase jitter includes compensating the initial channel estimate for sampling phase jitter responsive to the packet having been received at a data rate greater than a first predetermined data rate, and not compensating the initial channel estimate for sampling phase jitter responsive to the packet having been received at a data rate less than or equal to the first predetermined data rate.

18 Claims, 9 Drawing Sheets

(56) References Cited

U.S. PATENT DOCUMENTS

| | | | |
|---|---|---|---|
| 5,283,811 A * | 2/1994 | Chennakeshu et al. | 375/233 |
| 5,345,440 A | 9/1994 | Gledhill et al. | |
| 5,450,456 A | 9/1995 | Mueller | |
| 5,608,764 A | 3/1997 | Sugita et al. | |
| 5,640,431 A | 6/1997 | Bruckert et al. | |
| 5,732,113 A | 3/1998 | Schmidl et al. | |
| 5,732,339 A | 3/1998 | Auvray et al. | |
| 5,838,734 A | 11/1998 | Wright | |
| 5,870,438 A * | 2/1999 | Olafsson | 375/344 |
| 5,889,759 A | 3/1999 | McGibney | |
| 6,035,003 A | 3/2000 | Park et al. | |
| 6,094,452 A * | 7/2000 | Gelblum et al. | 375/222 |
| 6,198,782 B1 | 3/2001 | De Courville et al. | |
| 6,239,752 B1 | 5/2001 | Blanchard | |
| 6,658,063 B1 | 12/2003 | Mizoguchi et al. | |
| 6,690,747 B2 | 2/2004 | Petrus et al. | |
| 7,106,709 B2 | 9/2006 | Davidsson et al. | |
| 7,139,320 B1 * | 11/2006 | Singh et al. | 375/260 |
| 7,181,187 B2 | 2/2007 | Trachewsky et al. | |
| 7,286,516 B2 | 10/2007 | Delaney et al. | |
| 7,346,135 B1 | 3/2008 | Narasimhan | |
| 7,505,450 B2 | 3/2009 | Castagnoli | |
| 2002/0000938 A1 | 1/2002 | Hoashi et al. | |
| 2002/0065047 A1 | 5/2002 | Moose | |
| 2002/0085651 A1 | 7/2002 | Gu | |
| 2002/0097669 A1 | 7/2002 | Kim | |
| 2002/0167084 A1 | 11/2002 | Coccioli et al. | |
| 2003/0057545 A1 | 3/2003 | Shim et al. | |
| 2004/0001029 A1 | 1/2004 | Parsche et al. | |
| 2004/0008142 A1 | 1/2004 | Guo et al. | |
| 2004/0217472 A1 | 11/2004 | Aisenbrey et al. | |
| 2005/0088998 A1 | 4/2005 | Douglas et al. | |
| 2005/0119025 A1 | 6/2005 | Mohindra et al. | |
| 2005/0227631 A1 | 10/2005 | Robinett | |
| 2005/0273790 A1 | 12/2005 | Kearney et al. | |
| 2006/0151614 A1 | 7/2006 | Nishizawa et al. | |

FOREIGN PATENT DOCUMENTS

| | | |
|---|---|---|
| JP | 2003-188620 | 7/2003 |
| JP | 2005-064581 | 3/2005 |
| WO | WO03075472 A2 | 9/2003 |

OTHER PUBLICATIONS

Advanced Semiconductor Engineering, Inc. "IC Packaging Catalog 2001", pp. 61, 67, 70, 84. 2001.

ANSI/IEEE Std. 802.11-1999 Edition, Aug. 20, 1999; Sponsor LAN MAN Standards Committee of IEEE Computer Society, Part 11: Wireless LAN Medium Access Control (MAC) and Physical Layer (PHY) Specifications, Chapter 12 (pp. 138-146); Chapter 13 (p. 147) and Chapter 15 (pp. 195-223).

ANSI/IEEE Std. 802.11g/D2.8, May 2002, Draft 2002 Edition, Sponsor LAN MAN Standards Committee of IEEE Computer Society, "Further Higher-Speed Physical Layer Extension in the 2.4 GHz Band" pp. 1-48.

Communication dated Dec. 10, 2010 enclosing the Notice of Reasons for Rejection issued for Japanese Patent Application No. 2006-158732; 7 pages.

Eli Maor, "e The Story of a Number", 1994, Princeton University Press, p. 172.

European Search Report dated Jul. 25, 2006 re: European Patent Application No. EP 06 01 0553; 6 pages.

European Search Report dated Jul. 25, 2006 re: European Patent Application No. EP 06 01 0755; 4 pages.

Fernandez-Getino Garcia, "Tracking of time-frequency misalignments in 2D-pilot-symbol-aided coherent OFDM systems", IEEE VTS-Fall VTC 2000, 52nd Vehicular Technology Conference, 2000, vol. 4, Sep. 24-28, 2000; pp. 1704-1704 vol. 4.

First Office Action from the Patent Office of the People's Republic of China dated Feb. 27, 2009 for Chinese Application No. 200610083505.4; 8 pages.

Hyoung-Kuy Song, "Frequency—offset synchronization and channel estimation for OFDM-based transmission", Communications Letters, IEEE, vol. 4, Issue 3, Mar. 2000; pp. 95-97.

IEEE Std. 802.11a-1999, Sep. 16, 1999; Sponsor LAN MAN Standards Committee of IEEE Computer Society, "Part 11: Wireless LAN Medium Access Control (MAC) and Physical Layer (PHY) Specifications, High-Speed Physical Layer in the 5 GHz Band" pp. 1-83.

IEEE Std. 802.11b-1999, Sep. 16, 1999; Sponsor LAN MAN Standards Committee of IEEE Computer Society, "Part 11: Wireless LAN Medium Access Control (MAC) and Physical Layers (PHY) Specifications, Higher-Speed Physical Layer Extension in 2.4 GHz Band", Chapter 18; pp. 11-58.

In ho Hwang, "Frequency and Timing Period Offset Estimation Technique for OFDM Systems", Electronics Letters, vol. 34, Issue 6, Mar. 19, 1998; pp. 520-521.

Official Action and Written Opinion with Australian Search Report dated Oct. 8, 2007 re: Singapore Patent Application No. 200603686-7 entitled "Wireless Local Area Network Communications Module and Integrated Chip Package"; 13 pages.

Simoens, "A New Method for Joint Cancellation of Clock and Carrier Frequency Offsets in OFDM Receivers Over Frequency Selective Channels", IEEE 51st Vehicular Technology Conference Proceedings, 2000. VTX 2000-Spring Tokyo. 2000 vol. 1, May 15-18, 2000; pp. 390-394 vol. 1.

Thierry Pollet and Marc Moeneclaey, "Syncronizability of OFDM Signals", Communication Engineering Lab, University of Ghent, St. Pietersnieuwstraat 41, B-9000 Ghent, Belgium, IEEE 1995 pp. 2054-2058.

Written Opinion with Australian Search Report dated Feb. 14, 2008 re: Singapore Patent Application No. SG 200603676-8; 10 pages.

* cited by examiner

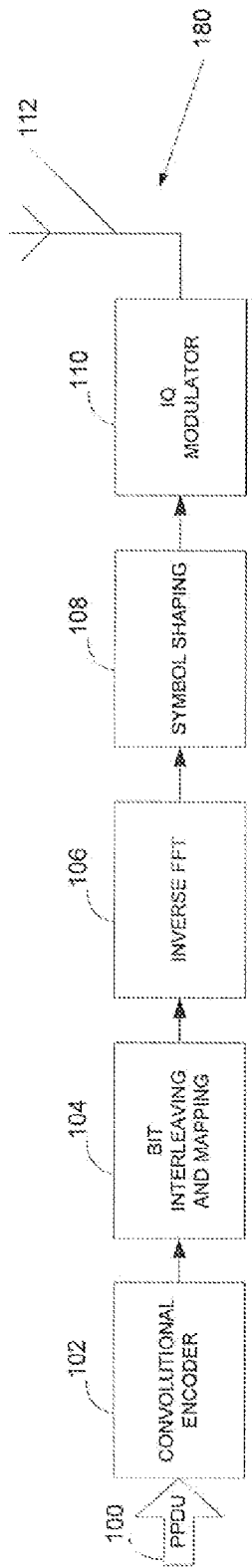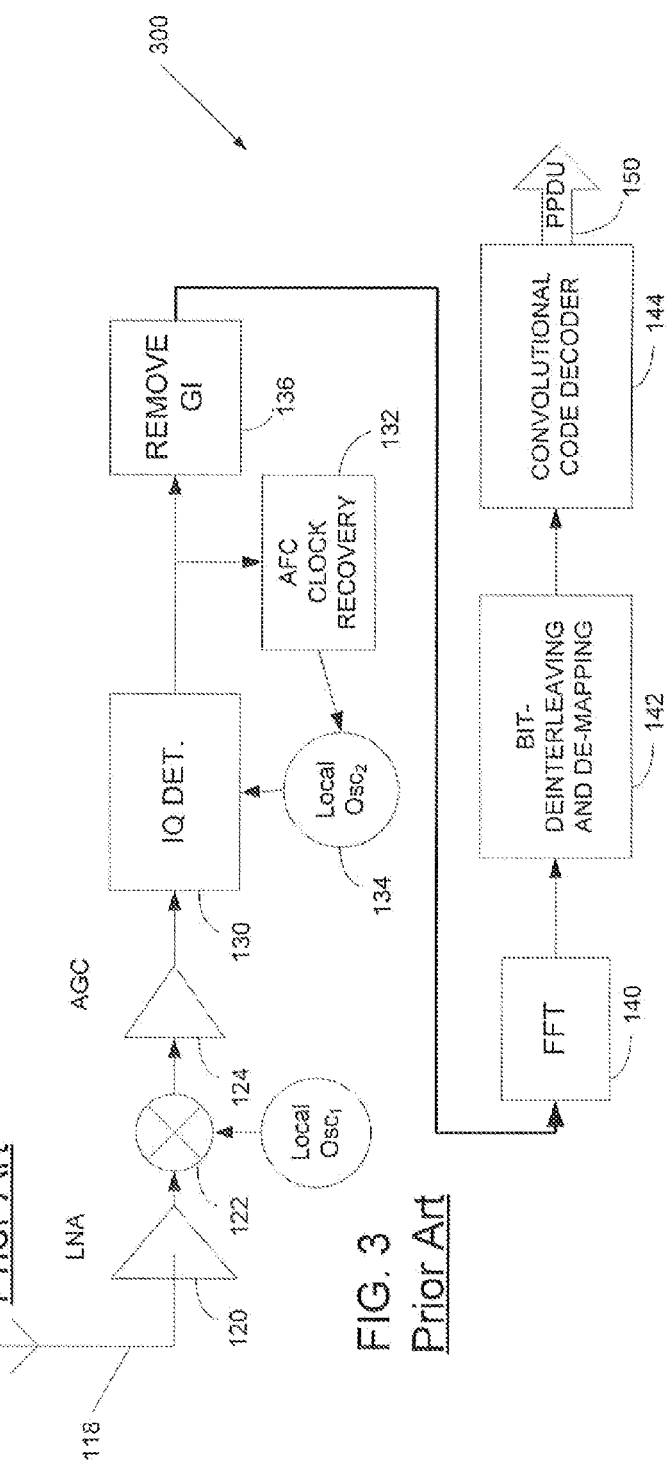

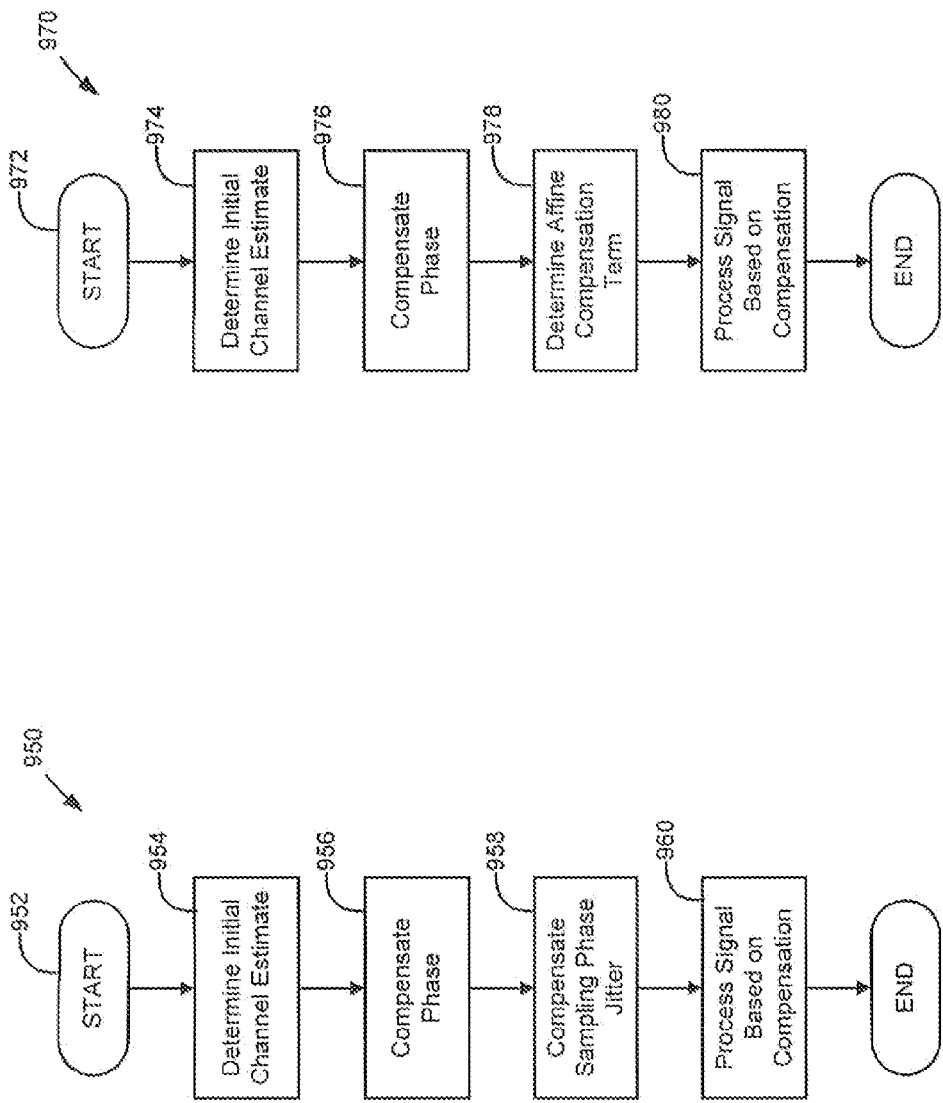

COMPENSATION FOR RESIDUAL FREQUENCY OFFSET, PHASE NOISE AND SAMPLING PHASE OFFSET IN WIRELESS NETWORKS

RELATED APPLICATION

This application is a continuation of U.S. application Ser. No. 12/615,605 (now U.S. Pat. No. 8,223,893), filed Nov. 10, 2009, which is a continuation of U.S. application Ser. No. 12/070,375 (now U.S. Pat. No. 7,616,719), filed Feb. 15, 2008, which is a continuation of U.S. application Ser. No. 10/193,439 (now U.S. Pat. No. 7,346,135), filed Jul. 10, 2002, which claims the benefit of U.S. Provisional Application No. 60/356,475, filed Feb. 13, 2002. The disclosures of the above applications are incorporated herein by reference in their entirety.

TECHNICAL FIELD

The invention is in the field of wireless communications and, more specifically, pertains to improved performance in an OFDM receiver physical layer implementation by fine tuning each channel estimate to compensate for sample phase jitter.

BACKGROUND OF THE INVENTION

The wireless local area network or WLAN is expanding rapidly into a wide variety of implementations and applications. This rapid growth is attributable to several factors, including improved accuracy (lower BER), increased bandwidth and falling costs. While wireless networking was considered fairly exotic and certainly expensive just a few years ago, it is rapidly gaining users in all markets. Commercial enterprises can avoid considerable wiring costs by deploying wireless networks in their buildings and campuses. Even families and home office workers now enjoy the benefits of wireless networks, as the cost of an access point has fallen below $100 at retail and an individual WLAN "station" costs around $50. (A station or "client" has a MAC and a PHY, and connects to the wireless medium. Common implementations include standard PC-type circuit boards and PCM cards.)

High manufacturing volumes, lower costs, and technical improvements to a large degree can all be traced to standardization. The IEEE established the 802.11 Working Group in 1990, and has promulgated various standards in this area in recent years. In 1999, the IEEE-SA Standards Board approved the 2.4 GHz, 11 Mbps 802.11b and the 5 GHz, 54 Mbps 802.11a high-rate PHY extensions. These two standards have relatively identical MAC layers, but different PHY layers. The IEEE Standard 802.11 (1999), the IEEE Standard 802.11a (1999) and 802.11b (1999) high-rate PHY Supplements, and the 802.11g (draft 2002) high-rate PHY Supplement are incorporated herein fully by reference.

The lower bandwidth 802.11b standard was first to be widely implemented, fueling considerable growth and competition in the WLAN industry. That system has several drawbacks, however. The 2.4 GHz (unlicensed) band is very congested, hosting everything from wireless telephones to Bluetooth transceivers to microwave ovens. (Although the maximum packet length in the 802.11 protocol was designed to operate between the 8 msec pulses of the microwave oven magnetron.) The 2.4 Gz system provides limited numbers of channels (three non-overlapping) and bandwidth limited to 11 Mbps best case.

The 5 GHz ("Wi-Fi5") band is relatively clean. The 802.11a extension provides for 8 non-overlapping channels (plus 4 channels in the upper band), and improved bandwidth up to 54 Mbps. Systems can provide higher bandwidths, and still be compliant, as long as they implement at least the mandatory data rates, namely 6, 12, and 24 Mbps. Some manufacturers are offering "dual band" systems that implement both 802.11b and 802.11a standards. Because of differences in the PHY layer, particularly different frequency radios and modulation schemes, dual band systems essentially have to implement both types of systems in one package.

Another extension of the basic 802.11 architecture is the 802.11g proposal (not yet a standard), which is something of a hybrid. It operates in the 2.4 GHz band, like 802.11b, but uses orthogonal frequency division multiplexing OFDM in the PHY layer, like 802.11a, to achieve data rates in excess of 20 Mbps. (802.11g also employs Complementary Code Keying (CCK) like 802.11b for data rates below 20 Mbps. In fact it has a variety of operating modes). Final ratification of the 802.11g protocol is expected in 2003. It is attractive in part because the 2.4 GHz band is largely available world-wide. Some predict that combination 802.11a/g designs will soon supplant 802.11a/b. Indeed, the present invention is applicable to 802.11a/g combination designs (as well as each of them separately).

As noted, both 802.11a and 802.11g protocols employ OFDM encoding. Briefly, OFDM works by dividing one high-speed data carrier into multiple low-speed sub-carriers which are used for transmission of data, in parallel. Put another way, the data stream is divided into multiple parallel bit streams, each transmitted over a different sub-carrier having a lower bit rate. In the case of 802.11a/g there are 52 such sub-carriers, 48 of which are used to carry data. (The other four are pilot sub-carriers, discussed later.) These sub-carriers are orthogonal to each other, so they can be spaced closer together than in conventional frequency-division multiplexing. Mathematically, the integral of the product of any two orthogonal sub-carriers is zero. This property allows separating the sub-carriers at the receiver without interference from other sub-carriers. OFDM systems and circuits are described in greater detail in, for example, U.S. Pat. Nos. 5,345,440; 5,889,759 and 5,608,764 each incorporated herein fully by this reference.

In OFDM systems, carrier frequency offset and noise can produce large degradations of the Bit Error Rate (BER) performance. Indeed they not only produce extra noise due to Inter-Carrier Interference (ICI) but also a parasitic rotation of the symbols which also increases the BER as further discussed later. Carrier frequency offset means any difference in frequency between the carrier frequency generators in the transmitting and receiving circuitry.

U.S. Pat. No. 6,198,782 to De Courville et al. describes methods and apparatus for carrier and clock frequency offset compensation. De Courville obtains a ML estimate jointly for carrier and clock frequency offsets. However, the approach in the 782 patent first removes the channel using equalization for coherent modulation systems (col. 5, line 5). The equalization leads to different noise variance on each subcarrier (i.e. non-white noise). This factor apparently is not considered in the derivation of the ML estimator in the patent (col. 7, line 7).

Several methods are known for estimating and compensating a carrier frequency offset. See for example, U.S. Pat. No. 5,450,456 to Mueller. These techniques are useful, but they do not address sample phase noise or "jitter", in other words discrepancies between the sample rate in a transmitter and a receiver.

SUMMARY OF THE INVENTION

We have discovered improved methods and apparatus to improve performance by compensating channel estimates in an OFDM receiver. The method in one embodiment calls for determining an initial channel estimate responsive to the "training signal" in the preamble of a received packet of OFDM symbols; compensating the initial channel estimate to adjust for carrier frequency offset; and further compensating the initial channel estimate to compensate for sampling phase offset encountered at the receiver A/D converter. Preferably, the compensation to accommodate sampling phase jitter includes determining a specific compensation term for each sub-carrier of the OFDM symbols. More specifically, each sub-carrier specific compensation term increases linearly as a function of the sub-carrier index.

The present invention obtains the ML estimates before equalization such that the additive noise remains white. Furthermore, the ML estimates derived in prior art, such as De Courville, consist of pure phase factors with unit magnitude. The present invention, by contrast, models the distortion by complex factors to allow compensation of the common phase error (due to phase noise) and compensation of the average value of the sampling clock jitter (i.e., the average sampling phase offset for each OFDM symbol).

The compensated channel estimates are given by $$\tilde{H}_k = (A + kB)\hat{H}_k$$

where A and B are complex numbers. This compensation method has a constant term A to account for residual carrier frequency offset and phase noise, and a second term kB that increases linearly with the sub-carrier index to account for sampling phase offsets. Maximum likelihood techniques can be used to estimate the terms A and B.

Compensation in accordance with the invention can be implemented in hardware, software, or a combination of the two. It can be realized in one or more integrated circuits to minimize size and power requirements, with on-board and/or external memory facilities.

Additional aspects and advantages of this invention will be apparent from the following detailed description of particular embodiments thereof, which proceeds with reference to the accompanying drawings.

BRIEF DESCRIPTION OF THE DRAWINGS

FIG. 1 is a simplified block diagram of an OFDM transmitter PMD

FIG. 3 is a simplified block diagram of an OFDM receiver PMD.

FIG. 10 is an exemplary channel estimate compensation method according to the present disclosure.

FIG. 11 is another exemplary channel estimate compensation method according to the present disclosure.

DETAILED DESCRIPTION OF THE EMBODIMENTS

Figure 2:
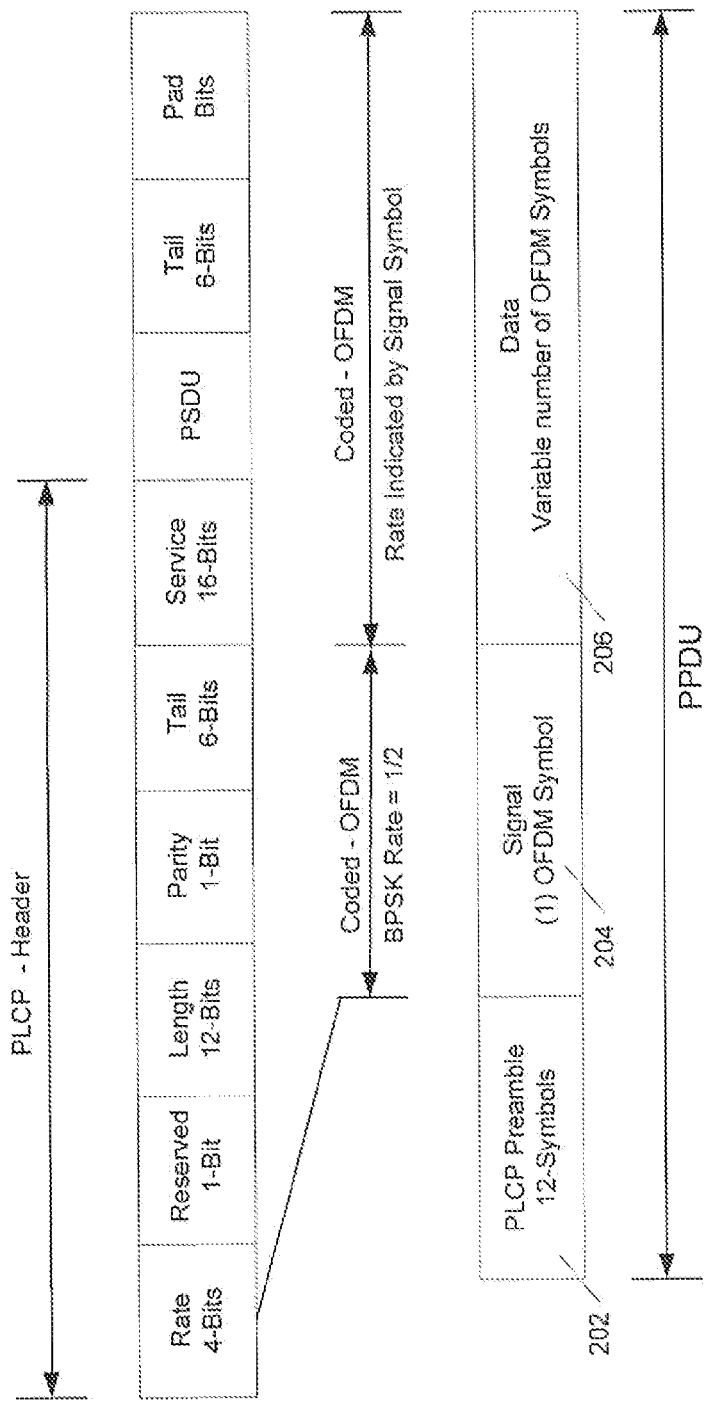
FIG. 2 is a diagram of an OFDM PPDU frame.

FIG. 1 is a simplified block diagram of an OFDM transmitter PMD compliant with the IEEE 802.11a standard. This illustrates generally a representative environment or application in connection with which the present invention can be used. In FIG. 1, an outbound PPDU, i.e. a data unit, is input at 100. This data unit, described in greater detail below, has a preamble, a header, data portion, tail, pad bits etc. The bit stream is input to a convolutional encoder 102. The information preferably is encoded using convolutional encoding rate R=½, ⅔, or ¾ depending on the specified data rate, and using known polynomials.

Next the encoded data is input to bit interleaving and mapping block 104. Bit interleaving is accomplished by a block interleaver with a block size corresponding to the number of bits in a single OFDM symbol, $N_{CBPS}$, as detailed in the 802.11a standard at 17.3.5.6. The first permutation ensures that adjacent coded bits are mapped onto nonadjacent sub-carriers. The second permutation step ensures that adjacent coded bits are mapped alternately onto less and more significant bits of the constellation and, thereby, long runs of low reliability (LSB) bits are avoided.

Block 104 in FIG. 1 also represents mapping the data, in other words symbol modulation. The encoded and inter-leaved binary serial input data is divided into groups of bits, each group sized according to the selected modulation (1, 2, 4 or 6 bits). For example, 64-QAM modulation maps 6-bit quantities onto the constellation. The same procedures can be extended to higher rate encoding, e.g. 256-QAM, in which case each group of 8 bits of the serial data is mapped onto one complex number (I+jQ) corresponding to a location on the 256-QAM constellation. The output values are multiplied by a normalization factor, depending on the base modulation mode (for 64-QAM, it is $1/\sqrt{42}$) to achieve the same average power for all mappings.

Each group of 48 complex numbers is associated with one OFDM symbol. Thus 48×6=288 data bits are encoded per OFDM symbol in the case of 64-QAM constellation bit encoding. The symbol duration is 4.0 μsec. Each group of 48 numbers is mapped to a corresponding one of 48 useful sub-carriers, frequency offset index numbers −26 to +26. Accordingly each sub-carrier (except the pilot sub-carriers) will be modulated by one complex number for each OFDM symbol in the current data unit.

In each symbol, four of the sub-carriers are dedicated to pilot signals to assist in coherent detection. They are also used in the accordance with the present invention for compensating the channel estimates to adjust for sample phase jitter. The pilot signals are put in sub-carriers −21, −7, 7 and 21 according to the industry standard. The pilots are BPSK modulated by a pseudo binary sequence to prevent the generation of spectral lines.

The inverse FFT 106 receives all 52 sub-carrier signals and combines them to form a time domain digital signal. Next, a guard interval (not shown) is inserted. The guard interval is to increase immunity to multipath by extending the length of the transmitted symbol. (It is also known as CP or cyclic prefix.) The window length used in the demodulator in the receiver to decode the symbol is that of the active symbol length, in other words excluding the guard interval period. Symbol wave shaping follows, block 108, and then modulation onto I and Q phase quadrature carriers at 110, and finally the combined signal is modulated onto the radio frequency carrier fc for transmission from antenna 112. To summarize mathematically, as noted above, the transmitted time-domain signal (after D/A conversion at rate 1/T) is represented by $$x(t) = \frac{1}{N}\sum_{k=0}^{N-1} X_k e^{j\frac{2\pi kl}{NT}} \quad (1)$$

where $X_k$ are the frequency-domain data symbols. In other words, the N values $X_k$ represent the respective values of the discretely-varying (e.g. QPSK or QAM) signals modulating the OFDM carriers.

Before describing the receiver, we examine more closely the structure of the data unit frame and how it is designed to assist the receiver. FIG. 2 is a block diagram illustrating the structure of a PLCP protocol data unit (PPDU) frame, in accordance with the IEEE 802.11a standard. In particular, this frame structure is a part of the IEEE 802.11a physical layer extension to the basic 802.11 protocol. The 802.11a extension defines requirements for a PHY operating in the 5.0 GHz unlicensed frequency bands and data rates ranging from 6 Mbps to 54 Mbps.

Under this protocol, the PPDU (PLCP protocol data unit) frame consists of a PLCP preamble and signal and data fields as illustrated in FIG. 2. The receiver uses the PLCP preamble to acquire the incoming OFDM signal and synchronize the demodulator. The PLCP header contains information about the PSDU (PLCP service data unit) or payload from the sending OFDM PHY. The PLCP preamble and the signal field are always transmitted at 6 Mbps, binary phase shift keying, modulated using convolutional encoding rate R=½.

The PLCP preamble 202 is used to acquire the incoming signal and train and synchronize the receiver. The PLCP preamble consists of 12 symbols, 10 of which are short symbols, and 2 long symbols. The short symbols are used to train the receiver's AGC and obtain a course estimate of the carrier frequency and the channel. The long symbols are used to fine-tune the frequency and channel estimates. Twelve sub-carriers are used for the short symbols and 53 for the long. The training of an OFDM is accomplished in 16 microseconds. This is calculated as 10 short symbols times 0.8 microseconds each, plus 2 long training symbols at 3.2 microseconds each, plus the guard interval. See IEEE standard 802.11a (1999) Section 17.3.3. These training symbols, as noted above, provide for a channel and frequency offset estimation, but do not compensate for other factors such as sampling frequency jitter.

Referring again to FIG. 2, the preamble field 202 is followed by a signal field 204 which consists of one OFDM symbol. This contains the rate and length fields as requested by the MAC. The rate field conveys information about the type of modulation and the coding rate as used in the rest of the packet. The encoding of the SIGNAL single OFDM symbol is performed with BPSK modulation of the sub-carriers and again using convolutional coding at R=½. The SIGNAL field is composed of 24 bits, with bits 0 to 3 encoding the rate, bit 4 reserved, and bits 5-16 encoding the length of the packet, with the LSB being transmitted first. A single parity bit and 6-bit tail field complete the SIGNAL symbol. Finally, the SIGNAL field 204 is followed by the data 206 comprising a variable number of OFDM symbols including the SERVICE field still forming part of the PLCP Header, consistent with the length specified in the SIGNAL field 204.

Referring now to FIG. 3, a simplified block diagram of a receiver is shown with the RF receiving antenna 118 at the left. The receiver includes a low-noise amplifier 120, IF detector 122 driver by a local oscillator, and automatic gain control circuit (AGC) 124 as are well known. The resulting signal is input to an IQ detector 130 to recover I and Q phase quadrature analog signals, which are used by AFC clock recover recovery 132 to adjust local oscillator 134 to synchronize with received signals. The recovered signals are converted to digital data by A/D sampling (not shown), the guard interval is removed at element 136, and the stream of data is converted to parallel form for input to FFT 140.

The FFT (implementation of the Discrete Fourier Transform) demodulates the data from the sub-carrier signals to recover the 52 signals which in turn are serialized and then input to block 142 for bit de-interleaving and de-mapping (from the constellation) back into a serial binary stream, which then undergoes convolutional decoding 144 to recover the inbound data unit PPDU 150 transmitted by an incident OFDM transmitter arranged in accordance with the transmitter 180 shown in FIG. 1. Further details of this type of receiver are known, but the need remains for improvements in performance especially at higher data rates, i.e. above 54 Mbps which is not currently considered by the IEEE 802.11a (1999) and 802.11g (2002 draft) standards.

The OFDM system can be modeled as follows. The transmitted time-domain signal (after D/A conversion at rate 1/T) is represented by e.g. n(1) discussed above, where $X_k$ are the frequency-domain data symbols. In other words, the N values $X_k$ represent the respective values of the discretely-varying (e.g. QPSK or QAM) signals modulating the OFDM carriers.

Multipath is a performance concern that also must be taken into account. Multipath occurs when the direct path of the transmitted signal is combined with reflected signal paths, resulting in a corrupted signal at the receiver. The delay of the reflected signals, a function of the propagation environment, typically around 50-300 nanoseconds, is commonly known as delay spread. We model the transmitted signal as distorted by a multipath channel with impulse response h(t). Moreover, at the receiver, residual frequency offset and phase noise contribute to a multiplicative distortion $e^{j\phi(t)}$. Finally, white Gaussian noise v(t) is added to form the received signal y(t):

$$y(t) = e^{j\phi(t)}[h(t)*x(t)] + v(t). \quad (2)$$

The received signal is sampled at the A/D converter (at rate 1/T) with some jitter (represented by sn) on the sampling phase. Thus, the A/D output can be written as $$y_n = y([n+s_n]T) \quad (3)$$
$$= e^{j\phi_n}\int h(\tau)x([n+s_n]T - \tau)d\tau + v_n$$

where $N_n = ([n+s_n]T)$ and $v_n = v([n+s_n]T)$. After simplification, we have $$y_n = e^{j\phi_n} \cdot \frac{1}{N}\sum_{l=0}^{N-1} H_l X_l e^{j\frac{2\pi l(n+s_n)}{N}} + v_n \quad (4)$$

where $H_l = \int h(\tau)e^{-j\frac{2\pi l\tau}{NT}}d\tau.$

For data detection, the DFT (Discrete Fourier Transform) of $Y_k$ is computed and is given by $$Y_k = \sum_{n=0}^{N-1} y_n e^{-j2\pi kn/N} \quad (5)$$

-continued $$= \frac{1}{N} \sum_{l=0}^{N-1} H_l X_l \sum_{n=0}^{N-1} e^{j2\pi n(l-k)/N} e^{j(\phi_n + 2\pi l s_n/N)} + V_k$$

$$= \frac{1}{N} H_k X_k \sum_{n=0}^{N-1} e^{j(\phi_n + 2\pi k s_n/N)} + W_k$$

where $V_k$ is the DFT of $v_n$ and $W_k$ represents the intercarrier interference (ICI) and AWGN. If $|\phi_n + 2\pi k s_n/N| \ll 1$, $$Y_k \approx H_k X_k \left[ 1 + \frac{j}{N} \sum_{n=0}^{N-1} \phi_n + j\frac{2\pi k}{N} \cdot \frac{1}{N} \sum_{n=0}^{N-1} s_n \right] + W_k. \quad (6)$$

This equation (6) suggests that the channel estimates $\hat{H}_k$ can be compensated by multiplying the channel estimates by an estimate of the factor given in square brackets above. However, we have discovered that improved performance, especially at high data rates, can be achieved by using the following "affine" compensation factor. Here, "affine" means "linear plus constant". The compensating factor consists of a term that is linear with sub-carrier index (kB) plus a constant (A). The compensated channel estimates thus are given by $$\tilde{H}_k = (A + kB)\hat{H}_k \quad (7)$$

where A and B are complex numbers. This compensation method has a constant term A to account for residual carrier frequency offset and phase noise, and a second term kB that increases linearly with the sub-carrier index to account for sampling phase offsets. The "average" value of the jitter over one OFDM symbol results in the "sampling phase offset" for which we compensate. The next section describes maximum likelihood estimates for A and B.

Maximum Likelihood Compensation of Channel Estimates

From the pilot tones, $X_k$, $k \in \mathcal{K}$(cursive), the maximum likelihood estimates for A and B have been derived; the results are $$A_{ML} = \frac{m_{22}r_1 - m_{12}r_2}{m_{11}m_{22} - m_{12}^2} \quad (8)$$

$$B_{ML} = \frac{-m_{12}r_1 + m_{11}r_2}{m_{11}m_{22} - m_{12}^2} \quad (9)$$

where $$m_{11} = \sum_{k \in \mathcal{K}} |\hat{H}_k X_k|^2 \quad (10)$$

$$m_{12} = \sum_{k \in \mathcal{K}} k |\hat{H}_k X_k|^2 \quad (11)$$

$$m_{22} = \sum_{k \in \mathcal{K}} k^2 |\hat{H}_k X_k|^2 \quad (12)$$

$$r_1 = \sum_{k \in \mathcal{K}} Y_k \hat{H}_k^* X_k^* \quad (13)$$

$$r_2 = \sum_{k \in \mathcal{K}} k Y_k \hat{H}_k^* X_k^*. \quad (14)$$

The channel estimates are then compensated according to (7) before further processing.

Figure 4:
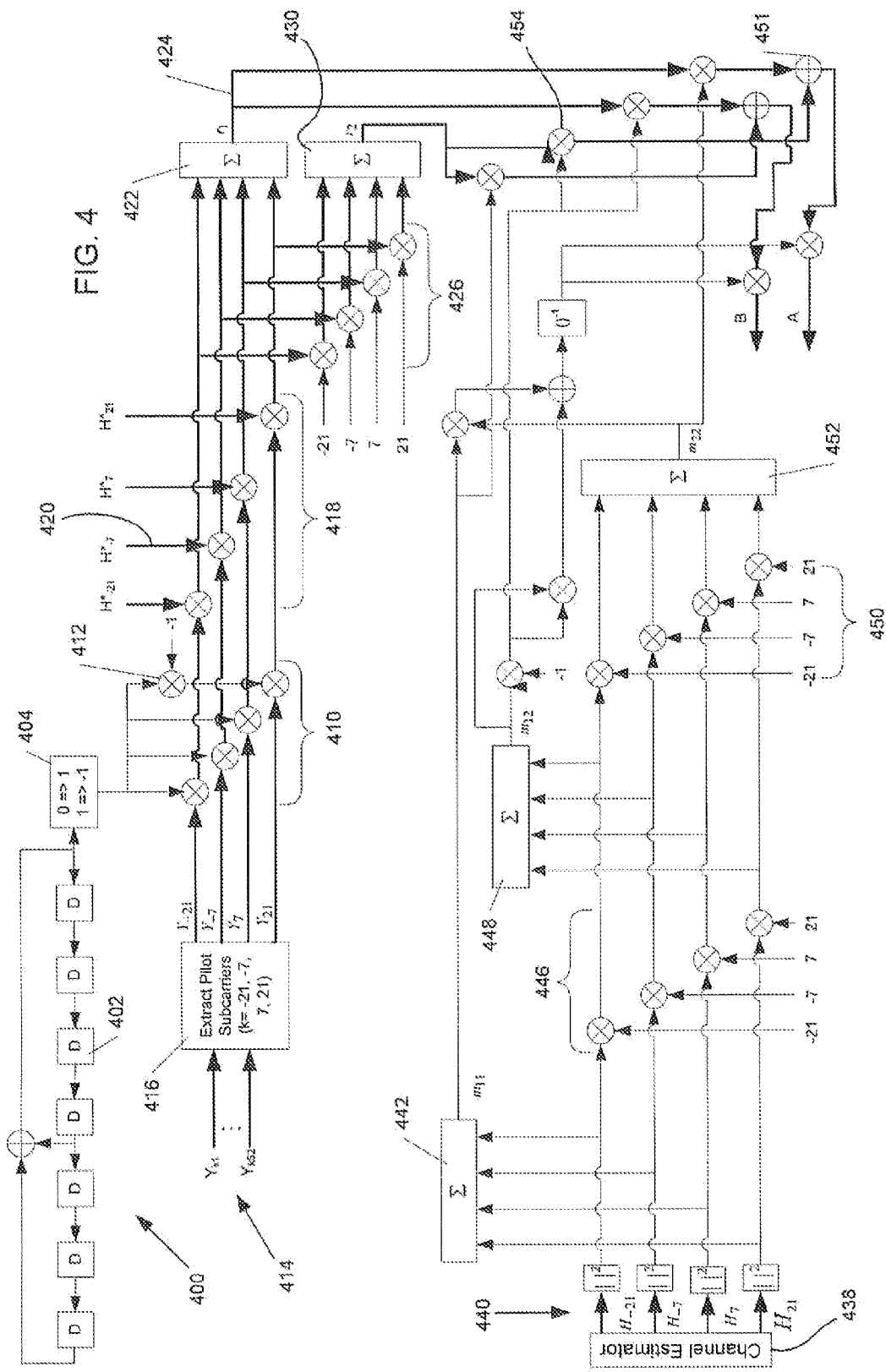
FIG. 4 Calculation flow diagram for improved compensation for common phase error and sampling phase drift.

FIG. 4 is a block diagram illustrating calculation of the compensation for updating channel estimates to compensate for carrier phase error and sampling phase offset in accordance with the present invention. In FIG. 4 (upper left) a shift register 400 is formed of a series of delay of individual delay elements, for example, 402 so as form and coder/decoder arranged to remove the known modulation of the pilot carriers. Each delay element 402 delays the signal by one OFDM symbol. The shift register is initialized to a state of all ones starting from the SIGNAL symbol (see FIG. 2). (The term "shift register" is used here to describe the functional arrangement of these elements. While a discrete "shift register" chip or circuit element could be used, a more practical and preferred embodiment would be to implement the corresponding functionality in the receiver DSP software.) Element 404 translates zeros into ones and ones into minus ones and the resulting signals are input to a series of four multiplier circuits 410 except that one of the signals is multiplied by minus one in multiplier 412.

The receiver FFT outputs, namely, the 52 sub-carrier signals $Y_{k1}$ to or through $Y_{k52}$ are input at 414 to element 416 which simply extracts the four pilot sub-carriers (k=−21, −7, 7, 21). These four signals are input to the series of multipliers 410 as illustrated. The products produced by 410 are the pilot tones with the known BPSK modulation removed (i.e. the multiplications are actually sign changes depending on the shift register output). Next, each of these signals is input to a corresponding multiplier, collectively labeled 418 and multiplied by the complex conjugate of the corresponding channel estimate, for example, $H^*_{-7}$ indicated at 420. The details of implementing multipliers, including complex multipliers, are well known. Finally, the resulting four products are summed in summation circuit 422 to form the signal $r_1$ at node 424.

To summarize, these elements illustrate an implementation of formula 13 above, i.e., the summation over the pilot signals of the corresponding data symbols times the complex conjugate of the corresponding channel estimates times the complex conjugates of the pilot tones. Element 404 converts the shift register output from bits (0 or 1) to +−1 to change the sign of the pilot sub-carrier signals. The pilot sub-carrier index numbers, fixed scalar quantities, are input to a series of multipliers 426 in which each of them is multiplied by the corresponding products of multipliers 418. The outputs (products) of multipliers 426 are summed in element 430 to form the quantity $r_2$ in accordance with the equation 14 above.

The channel estimates $H_{-21}$ $H_{-7}$ $H_7$ and $H_{21}$, which are generated, for example only, by a channel estimator 438, are input to a series of elements 440 each of which produces a quantity equal to the square of the magnitude of the corresponding input signal. Each channel estimate is, of course, a complex number, indicating the channel frequency and nominal phase. These quantities are summed in element 442 to provide $m_{11}$ in accordance with equation 10 above. The $|H_k X_k|^2$ are each multiplied by the corresponding sub-carrier index in multipliers 446, respectively, and then summed in element 448 to form the quantity $m_{12}$, as reflected in equation 11 above. The outputs (products) of multipliers 446 are again multiplied by the corresponding sub-carrier indexes in multipliers 450, and the resulting products are summed in element 452 so as to form the quantity $m_{22}$ in accordance with equation 12 above.

The remaining multipliers and adders correspond to the computations reflected in equations 8 and 9 above. For example, $r_2$ is multiplied by minus one times $m_{12}$ at a multiplier 454, and the result is summed together with $m_{22}$ times $r_1$ at element 451 to form the numerator portion of equation 8 that determines the value of A in the A term in the channel compensation factor. The remaining elements of FIG. 4 will be apparent to the reader in view of this description taken together with equations 8 and 9 above. It should be understood that FIG. 4 merely illustrates certain calculations; it is not a hardware schematic. The illustrated calculations can be implemented in hardware, e.g. a DSP or microprocessor core, with appropriate software, or dedicated custom hardware could be used, in whole or in part. Various arrangements can be devised by those of ordinary skill in view of the present disclosure without departing from the scope of the present invention.

Simulation Results

Figure 5:
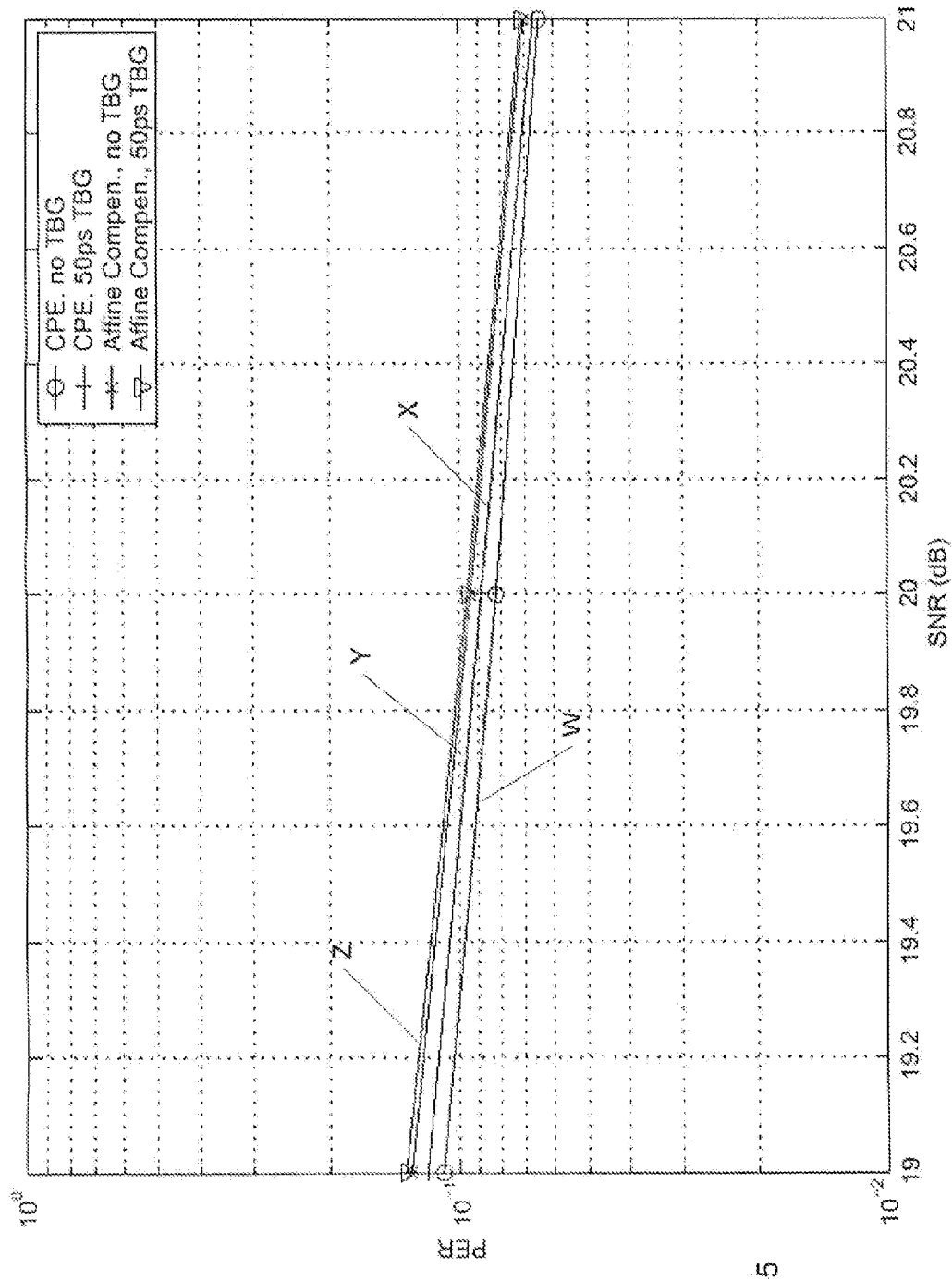
FIG. 5 is a plot of simulation results at 24 Mbps.

In this section, results of simulations for an IEEE 802.11a and 802.11g compliant receiver are presented to illustrate the performance of this compensation technique. FIG. 5 is a plot of the packet error rate (PER) versus signal-to-noise ratio (SNR) for the 24 Mbps mode and 50-ns rms delay spread multipath channels. The frequency offset is $\Delta f=210$ kHz. The rms phase noise is set to 3° with a 3-dB frequency of 20 kHz. The in-phase/quadrature imbalance is set to 1° and 1% gain imbalance. The channel estimates are also adapted using slicer decisions and a single pole filter with adaptation parameter $\alpha CH=\frac{1}{16}$.

In all the simulations, nonlinearity from the power amplifier is not included. The CPE curves labeled W and X in FIGS. 5-8 constitute the simulation results when the channel estimates are compensated using only the constant term, i.e.

$$\tilde{H}_k = A\hat{H}_k$$

The "no TBG" curves (labeled W and Y in FIGS. 5-8) show the simulation results when no sampling jitter was present; the "50 ps TBG" (where "ps" represents "picosecond") curves (labeled X and Z) in FIGS. 5-8 denote that the time-based generator contributes a sampling jitter with rms value of 50 ps, i.e., $sn = \Sigma_{m=0}^{n} \epsilon_m$, where $\epsilon_m$ are i.i.d. zero-mean Gaussian random variables with $\sigma_\epsilon T = 50$ ps ($\sigma_\epsilon$ is the standard deviation of $\epsilon_m$ and T is the D/A sampling period).

The results shown in FIG. 5 indicate that the loss due to TBG jitter is small and that the "CPE" method (shown by curves W and X) has a gain of around 0.3 dB at 10% PER compared to the "affine" compensation method (curves Y and Z in the figure). This small gain is due to the estimation of two parameters (A and B) in the "affine" method using the 4 noisy pilot tones, while the "CPE" method needs to estimate only one parameter (A).

Figure 6:
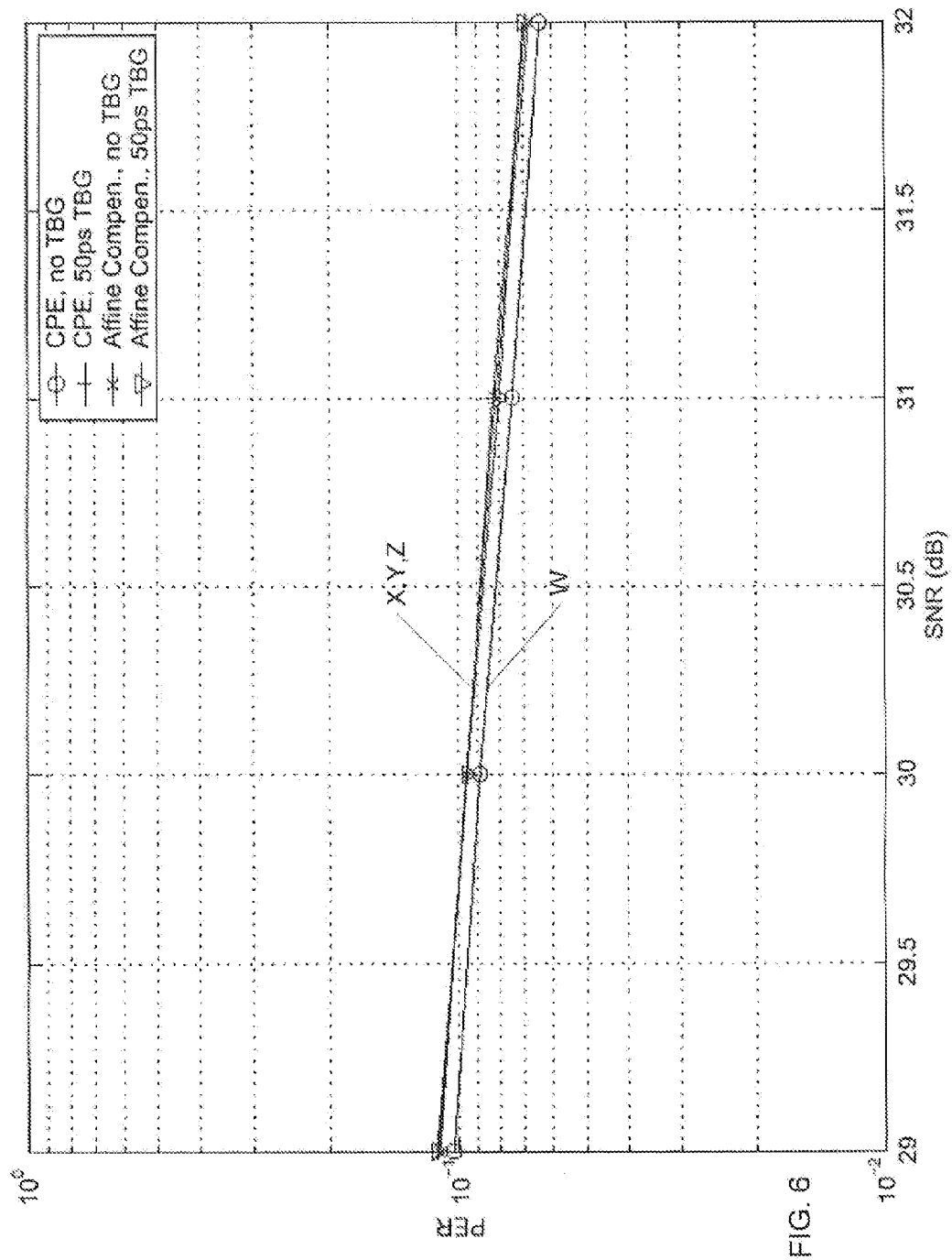
FIG. 6 is a plot of simulation results at 54 Mbps.

FIG. 6 plots simulation results at 54 Mbps mode and 25-ns rms delay spread. Here, the performance for "CPE" and "affine" methods are nearly identical in the presence of the TBG jitter (curves X and Z respectively). In other words, little performance benefit is realized under these conditions.

Figure 7:
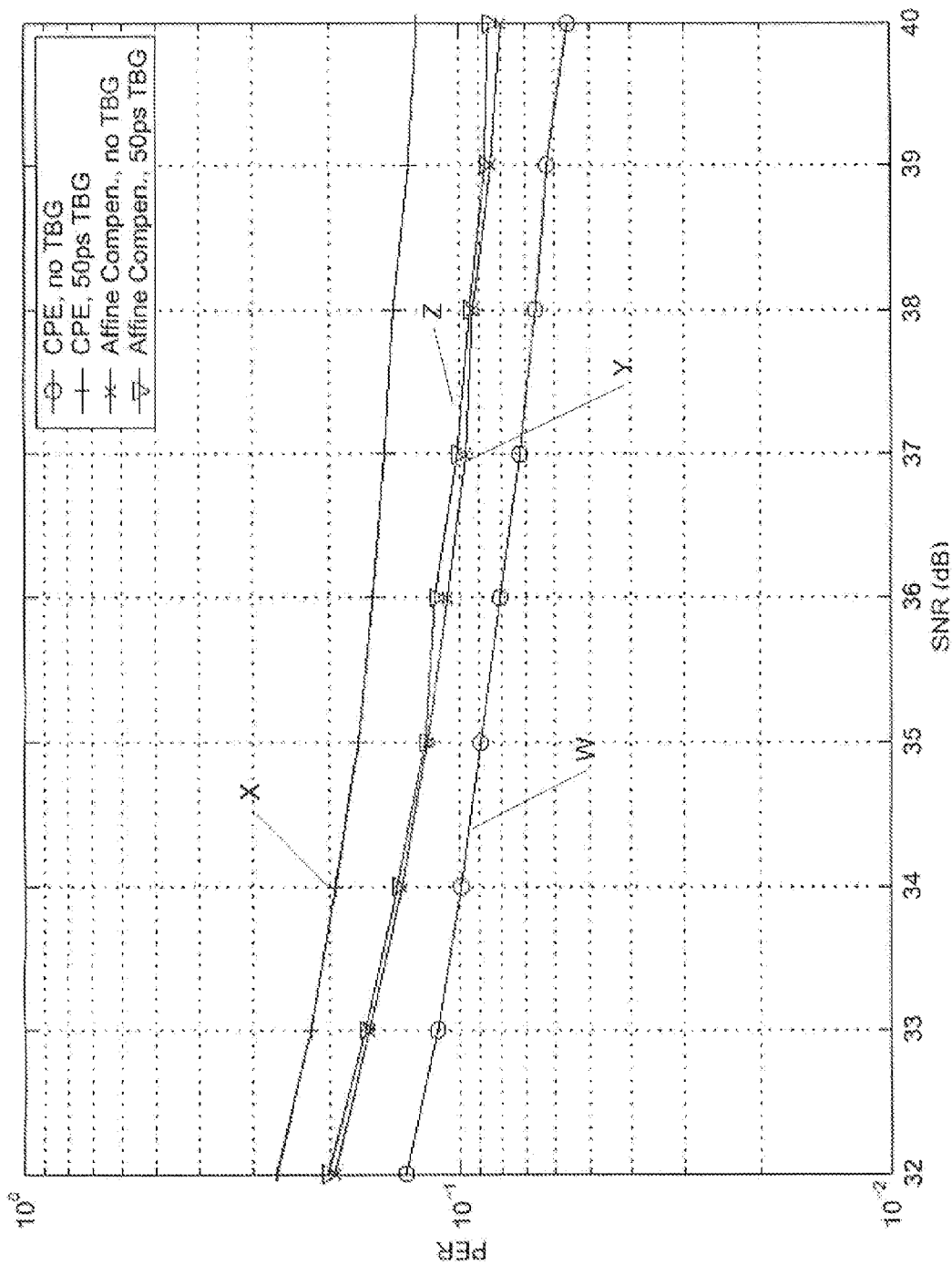
FIG. 7 is a plot of simulation results at 72 Mbps.

FIG. 7 plots simulation results for the 72 Mbps mode using 256 QAM and a rate ¾ convolutional code. From the plot, there is a loss of around 2.7 dB at 10% PER using the "affine" compensation method (curve Y) compared to the "CPE" method (curve W) when no jitter is present. As mentioned earlier, this loss is caused by estimated two parameters (A and B) using the 4 pilot tones, when in fact one parameter (A) is sufficient when no jitter is present. However, when TBG jitter is included, the "affine" compensation method (curve Z) performs significantly better than the "CPE" method (curve X).

Figure 8:
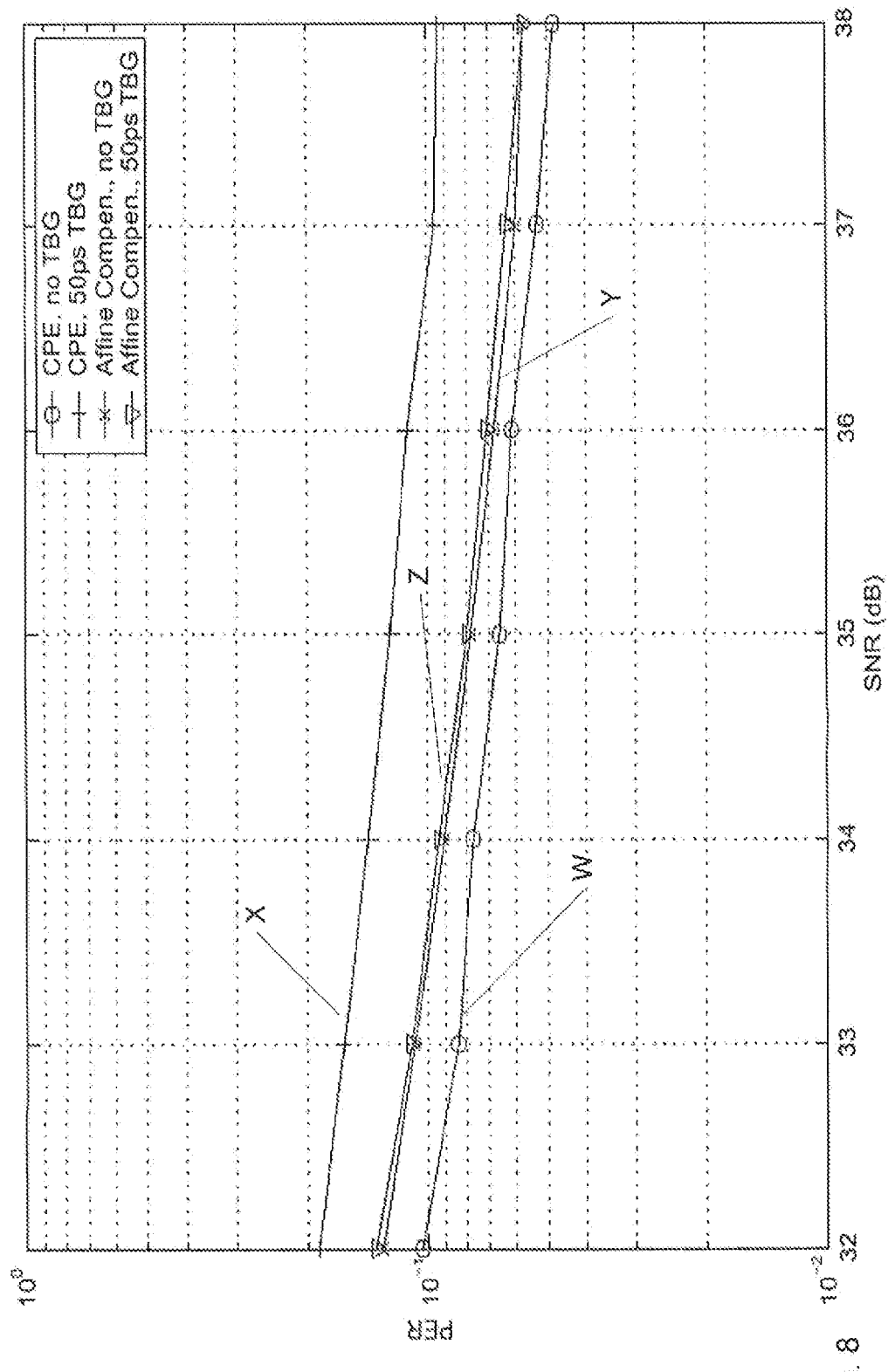
FIG. 8 is a plot of simulation results at 72 Mbps with 2 degrees rms phase noise.

Referring now to FIG. 8, for the 72 Mbps mode with rms phase noise of 2° and a 3-dB frequency of 20 kHz, the loss of the "affine" compensation method (curve Y) with respect to the "CPE" method (curve W) is around 1.2 dB at 10% PER when no jitter is present. However, when TBG jitter is present, the "affine" method (curve Z) has a gain of around 3.1 dB at 10% PER compared to the "CPE" method (curve X). Thus the present invention is particularly advantageous at 72 Mbps, and in general appears to be useful at data rates over 54 Mbps.

Implementation of a receiver that embodies the invention requires additional circuitry (consistent with the flow diagram illustrated in FIG. 4) as compared to a conventional receiver design, with an attendant increase in power consumption. However, since the invention is most useful at higher data rates, e.g. over 54 Mbps, it could be implemented with an enable or switching circuit so that the extra circuitry to implement the above compensation of channel estimates could be turned on only when needed, thereby saving power consumption during operation at lower data rates.

Figure 9:
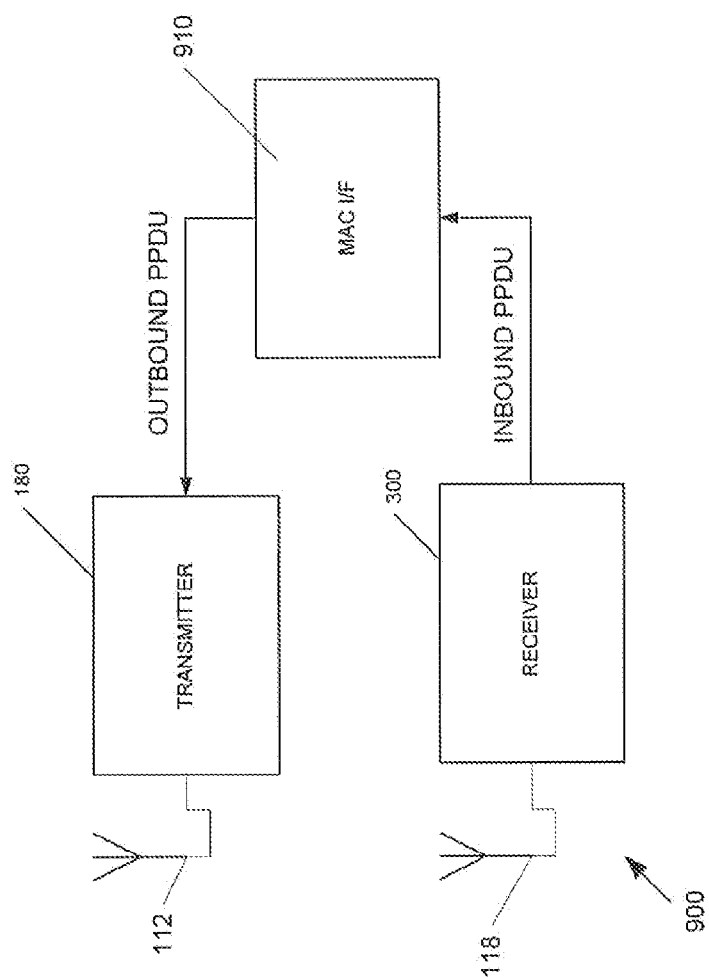
FIG. 9 is a simplified block diagram of a transceiver incorporating the transmitter of FIG. 1 and the receiver of FIG. 3.

Turning briefly to FIG. 9, FIG. 9 shows a transceiver 900 capable of implementing the teachings of the present invention, and includes receiver 300 described above with reference to FIG. 3 and a transmitter 180 described above with reference to FIG. 1 communicatively coupled to a network interface such as a MAC interface 910. As such, inbound PPDU (e.g. PPDU 150 in FIG. 3) recovered by the receiver 300 is conveyed to the MAC I/F 910, and outbound PPDU (e.g. PPDU 100 in FIG. 1) is relayed by the MAC I/F 910 to the transmitter 180 for transmission over a wireless medium such as air via the antenna 112. Though not shown in FIG. 9, the transceiver 900 may form an operational part of a network interface apparatus such as a PC card or network interface card capable of interfacing with the CPU or information processor of an information processing apparatus such as a desktop or laptop computer, and may be integrated within and constitute a part of such information processing apparatus. This network interface apparatus may alternatively form an operational component of a wireless communications access point such as a base station as will be appreciated by these ordinarily skilled in the art.

Referring now to FIG. 10, an exemplary channel estimate compensation method 950 begins in step 952. In step 954, an initial channel estimate is determined. For example, the initial channel estimate is responsive to training symbols in a preamble of a received packet comprising Orthogonal Frequency Division Multiplexing (OFDM) symbols. In step 956, a phase of the initial channel estimate is compensated to adjust for carrier frequency offset. In step 958, the initial channel estimate is selectively compensated for sampling phase jitter. For example only, the initial channel estimate may be compensated when the received OFDM symbols have a data rate greater than 54 Mbps. The compensating and selectively compensating may include estimating a first affine complex number having a nonzero imaginary component directed to the carrier frequency offset and the sampling phase jitter. The compensated channel estimates may be based on (A+kB) times the initial channel estimate, wherein A and B are complex numbers each having a nonzero imaginary component and k is a sub-carrier index, and wherein A is based on carrier frequency offset and phase noise and kB is based on a sub-carrier index. In step 960, a wireless signal is processed based on the compensation of the initial channel estimate.

Referring now to FIG. 11, another exemplary channel estimate compensation method 970 begins in step 972. In step 974, initial channel estimates $\hat{H}_k$ are determined based on training symbols in a preamble of a received packet comprising OFDM symbols. In step 976, a phase of the initial channel estimates is compensated based on:

$$\tilde{H}_k = (A + kB)\hat{H}_k$$

for $-26 \leq k \leq 26$;

wherein A and B are complex numbers having a nonzero imaginary component. In step 978, a specific affine compensation term for each sub-carrier of the OFDM symbols is determined. For example only, maximum likelihood estimates may be used for A and B where the estimates for A and B are determined based on:

$$A = A_{ML} = \frac{m_{22}r_1 - m_{12}r_2}{m_{11}m_{22} - m_{12}^2} \text{ and } B = B_{ML} = \frac{-m_{12}r_1 + m_{11}r_2}{m_{11}m_{22} - m_{12}^2}$$

where:

$$m_{11} = \sum_{k \in \mathcal{K}} |\hat{H}_k X_k|^2$$

$$m_{12} = \sum_{k \in \mathcal{K}} k |\hat{H}_k X_k|^2$$

$$m_{22} = \sum_{k \in \mathcal{K}} k^2 |\hat{H}_k X_k|^2$$

$$r_1 = \sum_{k \in \mathcal{K}} Y_k \hat{H}_k^* X_k^*$$

$$r_2 = \sum_{k \in \mathcal{K}} k Y_k \hat{H}_k^* X_k^*.$$

and where $X_k$ represents frequency domain data symbols and $Y_k$ represents sub-carrier symbols. In step 980, a wireless signal is processed based on the compensation of the initial channel estimate.

It will be obvious to those having skill in the art that many changes may be made to the details of the above-described embodiments of this invention without departing from the underlying principles thereof. The scope of the present invention should, therefore, be determined only by the following claims.

What is claimed is:

1. A transceiver, comprising:
a channel estimator configured to generate, based on a packet received over a channel, an initial channel estimate for the channel; and
a compensator configured to i) compensate a phase of the initial channel estimate to adjust for a carrier frequency offset associated with the channel, and ii) selectively compensate the initial channel estimate for sampling phase jitter,
wherein selectively compensating the initial channel estimate for sampling phase jitter includes
compensating the initial channel estimate for sampling phase jitter responsive to the packet having been received at a data rate greater than a first predetermined data rate, and
not compensating the initial channel estimate for sampling phase jitter responsive to the packet having been received at a data rate less than or equal to the first predetermined data rate.

2. The transceiver of claim 1, wherein the first predetermined data rate is 54 Mbps.

3. The transceiver of claim 1, wherein the packet comprises a preamble having training symbols, and wherein the channel estimator is configured to generate the initial channel estimate based on the training symbols of the preamble.

4. The transceiver of claim 3, wherein the training symbols comprise Orthogonal Frequency Division Multiplexing (OFDM) symbols.

5. The transceiver of claim 1, wherein at least one of compensating the phase of the initial channel estimate and selectively compensating the initial channel estimate for sampling phase jitter includes estimating a compensation factor.

6. The transceiver of claim 5, wherein the compensation factor comprises an affine complex number having a nonzero imaginary component associated with at least one of the carrier frequency offset and the sampling phase jitter.

7. The transceiver of claim 5, wherein the compensation factor has a first term and a second term, wherein the first term varies linearly with respect to an index of a plurality of sub-carriers associated with the packet, and wherein the second term is a constant term.

8. The transceiver of claim 7, wherein the second term is associated with the carrier frequency offset and phase noise.

9. The transceiver of claim 5, wherein estimating the compensation factor includes estimating the compensation factor based on pilot signals placed within predetermined subcarriers of a plurality of subcarriers associated with the packet.

10. A method, comprising:
generating, based on a packet received over a channel, an initial channel estimate for the channel;
compensating a phase of the initial channel estimate to adjust for a carrier frequency offset associated with the channel; and
selectively compensating the initial channel estimate for sampling phase jitter, wherein selectively compensating the initial channel estimate for sampling phase jitter includes
compensating the initial channel estimate for sampling phase jitter responsive to the packet having been received at a data rate greater than a first predetermined data rate, and
not compensating the initial channel estimate for sampling phase jitter responsive to the packet having been received at a data rate less than or equal to the first predetermined data rate.

11. The method of claim 10, wherein the first predetermined data rate is 54 Mbps.

12. The method of claim 10, wherein the packet comprises a preamble having training symbols, and wherein generating the initial channel estimate includes generating the initial channel estimate based on the training symbols of the preamble.

13. The method of claim 12, wherein the training symbols comprise Orthogonal Frequency Division Multiplexing (OFDM) symbols.

14. The method of claim 10, wherein at least one of compensating the phase of the initial channel estimate and selectively compensating the initial channel estimate for sampling phase jitter includes estimating a compensation factor.

15. The method of claim 14, wherein the compensation factor comprises an affine complex number having a nonzero imaginary component associated with at least one of the carrier frequency offset and the sampling phase jitter.

16. The method of claim 14, wherein the compensation factor has a first term and a second term, wherein the first term varies linearly with respect to an index of a plurality of sub-carriers associated with the packet, and wherein the second term is a constant term.

17. The method of claim 16, wherein the second term is associated with the carrier frequency offset and phase noise.

18. The method of claim 14, wherein estimating the compensation factor includes estimating the compensation factor based on pilot signals placed within predetermined subcarriers of a plurality of subcarriers associated with the packet.

* * * * *